United States Patent
Rossopoulos et al.

(10) Patent No.: US 7,504,604 B2
(45) Date of Patent: Mar. 17, 2009

(54) METHOD FOR SOLDERING MINIATURIZED COMPONENTS TO A BASEPLATE

(75) Inventors: Stephane Rossopoulos, Ursins (CH); Irène Verettas, Lausanne (CH); Reymond Clavel, Oulens/Echallens (CH)

(73) Assignee: Leica Geosystems AG, Heerbrugg (CH)

( * ) Notice: Subject to any disclaimer, the term of this patent is extended or adjusted under 35 U.S.C. 154(b) by 428 days.

(21) Appl. No.: 10/536,251

(22) PCT Filed: Dec. 1, 2003

(86) PCT No.: PCT/EP03/13519

§ 371 (c)(1), (2), (4) Date: Jun. 14, 2005

(87) PCT Pub. No.: WO2004/050287

PCT Pub. Date: Jun. 17, 2004

(65) Prior Publication Data

US 2006/0124614 A1 Jun. 15, 2006

(30) Foreign Application Priority Data

Nov. 29, 2002 (EP) .................................. 02026648

(51) Int. Cl.
  *B23K 26/00* (2006.01)
  *B23K 35/12* (2006.01)
(52) U.S. Cl. ............................. 219/121.66; 219/121.65; 228/249
(58) Field of Classification Search ............ 219/121.66, 219/121.65; 228/178, 179.1, 180.1, 180.21, 228/189, 245, 246, 249, 253
See application file for complete search history.

(56) References Cited

U.S. PATENT DOCUMENTS

| 3,590,467 A | 7/1971 | Chase et al. |
| 3,717,742 A | 2/1973 | Fottler |
| 6,284,998 B1 | 9/2001 | Sinkunas et al. |
| 6,333,483 B1 | 12/2001 | Ueno |

(Continued)

FOREIGN PATENT DOCUMENTS

EP 0 577 589 B1 1/1994

(Continued)

*Primary Examiner*—Kevin P Kerns
*Assistant Examiner*—Megha Mehta
(74) *Attorney, Agent, or Firm*—Oliff & Berridge, PLC

(57) ABSTRACT

The invention relates to a method for fixing a miniaturized component, especially comprising a micro-optical element, to a pre-determined fixing section of a baseplate by means of a soldered joint. Said baseplate comprises an upper side and a lower side, and the component comprises a base surface. At least the fixing section of the baseplate is coated on the upper side by a metallic layer which is applied at least in the fixing section in a continuously plane manner and thus without interruptions. Solder material is applied at least to the fixing section coated with the metallic layer. In one step of the method, the component is arranged above the fixing section, the base surface of the component being positioned above the solder material in such a way that they do not touch, are vertically interspaced and form an intermediate region between each other. In another step, thermal energy is supplied, especially by means of a laser beam, in a region which is locally limited essentially to the fixing section, in order to melt the solder from the lower side of the baseplate, such that the intermediate region is filled by drop formation of the melted solder, fixing both sides.

14 Claims, 3 Drawing Sheets

U.S. PATENT DOCUMENTS

| | | |
|---|---|---|
| 6,353,202 B1 | 3/2002 | Grötsch et al. |
| 6,380,513 B1 * | 4/2002 | Remy De Graffenried ....... 219/121.85 |
| 6,394,158 B1 | 5/2002 | Momeni |

FOREIGN PATENT DOCUMENTS

| | | |
|---|---|---|
| EP | 1 127 287 B1 | 8/2001 |
| GB | 1051393 | 12/1966 |
| WO | WO 99/26754 | 6/1999 |
| WO | WO 01/37019 A2 | 5/2001 |

* cited by examiner

FIG. 5A
FIG. 5B
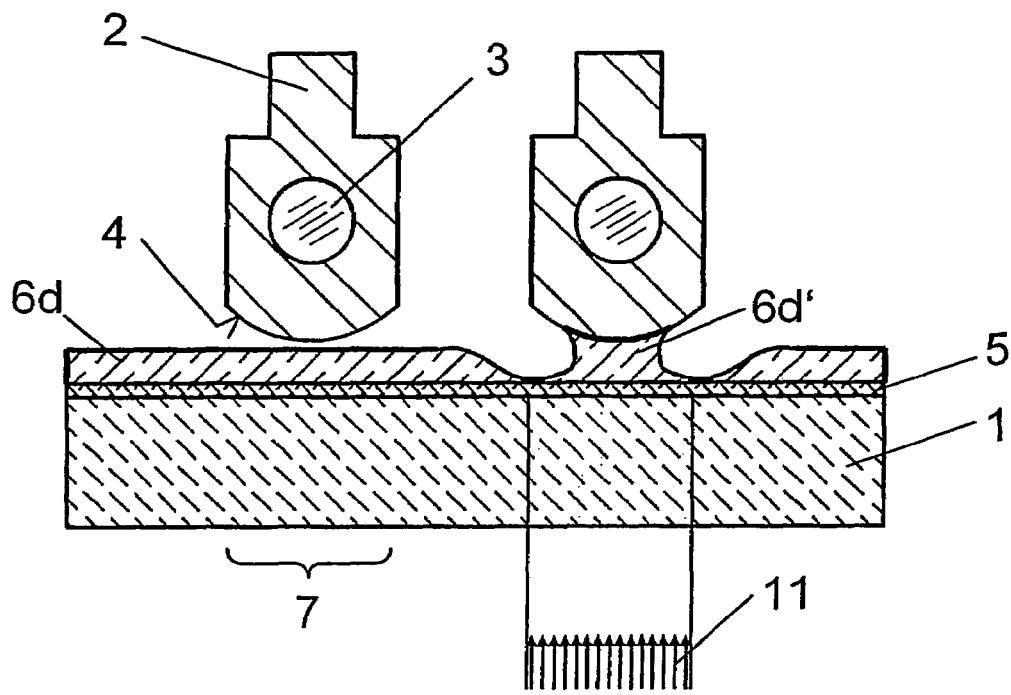
FIG. 6
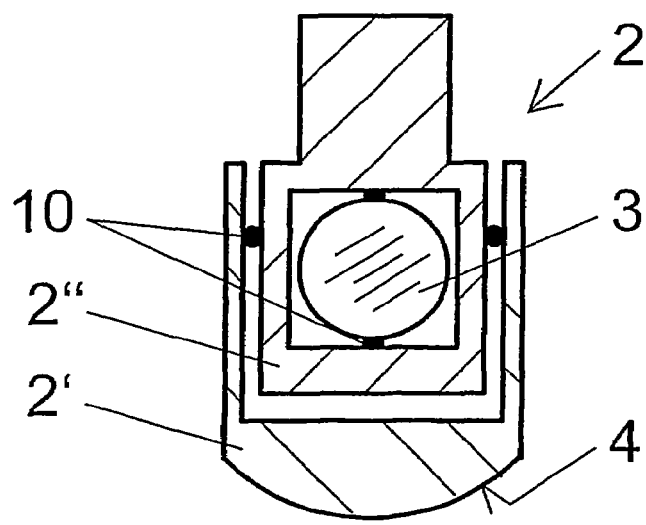

METHOD FOR SOLDERING MINIATURIZED COMPONENTS TO A BASEPLATE

The present invention relates to a. method for highly precise fixing of miniaturized components to a baseplate by means of a solder joint. In particular, the invention relates both to a laser soldering method for fixing microoptical components to a baseplate which is at least partly transparent to laser beams and is coated with a metallic layer and to the baseplate obtained by this method and a substrate for use in the method.

Different methods for fixing miniaturized components by means of a solder joint are known from the prior art.

WO 99/26754 describes a method for soldering miniaturized components to a baseplate. The baseplate is at least partly coated with a lattice-like metal pattern or metal structure. According to WO 99/26754, the patterned structure can be formed by a lattice of planar elements or a number of stripes which preferably intersect one another perpendicularly and form a lattice or some other structure which is characterized by a uniform alternation of metal regions and free regions. The planar elements may assume a rectangular shape, a square shape, a round shape or any shape which is suitable for use in this method. Here, the pattern step width should be at least one order of magnitude smaller than the dimensions of the component side to be fixed. The solder material is preferably applied to the component side to be fixed or optionally to the metal pattern of the baseplate. The component is arranged above the baseplate, the metal pattern and the solder material layer of the component or the solder material layer on the metal pattern and the component side being located opposite one another without contact and a vertical distance apart. Heat energy is then supplied from the uncoated side of the baseplate for melting the solder material or the solder material layer on the coated side on which the component is also arranged until drop formation of the solder material occurs, with the result that the solder material drops fill the intermediate space between the component and the baseplate for mutual fixing. The metallized sample regions provide a fixing region for the solder material, while the metal-free regions make it possible for a sufficient quantity of energy to pass through the baseplate in order to melt the solder material. When heat energy is supplied, a part of the energy thus passes through the uncoated regions of the metal pattern. The part which reaches those regions of the metal pattern which are coated with the metal either heats up the metal layer or is reflected. The energy is preferably applied by means of a laser beam. Owing to the lattice structure of the metal pattern on the baseplate, the choice of a suitable light absorption coefficient of the metal layer is particularly problematic since, on the one hand, the baseplate is not permitted to overheat and, on the other hand, a certain minimum temperature is required for carrying out the process. Usually, metal of the metal pattern covers about 70% of the surface of the baseplate. Less than 30% of the power of the laser beam is used for heating the solder material since one part of the approximately 70% of the remaining power heats up the baseplate and the other part is reflected.

For carrying out the soldering process, more than 15 W are required for the duration of 2 seconds. Different types of metal coatings are required depending on the chosen material of the baseplate. Moreover, a discrete effect occurs owing to the metal pattern if the solder material wets only those regions of the metal pattern which are coated with the metal layer but—in particular owing to the flow behaviour and the surface tension—not the uncoated metal-free regions of the metal pattern. Particularly in the case of a metal pattern which is coarse in relation to the side of the component side to be fixed, the result may therefore be asymmetric off centre soldered seams which—owing to the shrinkage of the solder material which inevitably takes place during solidification—are associated with a change in position of the component and/or a skew position.

In practice, it has been found that the solder material cools substantially more rapidly close to the transverse sides of the component than the remainder of the solder material. This can lead to asymmetries of the solidified solder material.

Since the fixing is effected by soldering of two different materials, different coefficients of thermal expansion in the case of the solder material and of the baseplate cause high stresses and distortions after the soldering process has been carried out. Depending on the mechanical resistance of the carrier material, parasitic local deformation may occur in the region of the solder joint owing to the high stresses.

By means of the known method described above, it is possible to achieve accuracies of about 2 microns in the 6 degrees of freedom. Particularly in the mounting of components which contain or carry microoptical elements, however, even higher accuracies of mounting are required.

There is therefore the need to improve the method described above and disclosed in WO 99/26754 in order to achieve a higher accuracy of mounting of miniaturized components, in particular microoptical elements, on a carrier plate and to optimize the entire method from the economic point of view.

Furthermore, flux-free and/or lead-free soldering is scarcely possible in the method described above. Experiments have shown that the use of flux-free solder material comprising Sn96Ag4 and a metal layer coated with tin, nickel and gold does not lead to the desired satisfactory results if the fixing is effected on a metal pattern as described in WO 99/26754 since a metal pattern has insufficient wettability.

Numerous further methods for fixing small components on a carrier plate are known from the area of the equipping technology for electronic surface-mounted circuits, SMD technology. In the case of electronic circuits, however, the requirements are completely different from those in the area relating to the mounting of microoptical components since lower precisions are required in the case of electronic circuits and highly accurate orientation in all 6 degrees of freedom is not required. Moreover, electronic circuits must by definition be composed of interrupted metal layers since it would be inexpedient to mount a large number of electronic components on a circuit board having a single uninterrupted metal layer. The completely free positionability of components on a carrier plate is neither required nor desired in the case of electronic circuits but is of decisive importance, for example, for building up a microoptical system on a carrier plate. Thus, approaches from electronic circuit board equipping technology are suitable only to a limited extent.

It is an object of the present invention to provide a method for fixing a miniaturized component, in particular comprising at least one microoptical element, to a baseplate by means of a solder joint, which method is distinguished by increased positional accuracy of the components compared with the known method and high cost-efficiency.

This object is achieved by realizing the features of the independent Claims. Features which develop the invention in an alternative or advantageous manner are evident from the dependent Patent Claims.

According to the invention, in order to fix a miniaturized component, comprising in particular a microoptical element, with its base surface to a baseplate by means of a solder joint, the baseplate is coated with a metal layer, the metal layer being applied in a continuously planar manner and hence being free of interruptions. The baseplate and the metal layer form a so-called substrate. The solder material is applied to the metal layer of the baseplate. Thereafter, the component is arranged above the baseplate, the solder material and the base surface of the component being present opposite one another without contact, a vertical distance apart and so as to form an intermediate space. By supplying heat energy in a region of the bottom of the baseplate, which region is locally limited substantially to the fixing section, the solder material is melted so that the intermediate space between the metal layer and the base surface of the component is filled by drop formation of the molten solder material for mutual fixing— optionally assisted by lowering of the component. As a result of solidification of the solder material, the mutual fixing is implemented.

Owing to the continuous, extensive metal layer, a substantially higher final accuracy of positioning of the component on the baseplate is achieved in comparison with the method of WO 99/26754 which employs the metal pattern, since the continuous metal surface is wet easily and more homogeneously with the solder material than is the case with an interrupted metal structure.

Moreover, the higher absorption coefficient of the metal layer results in a reduction of 40% in the laser beam power required for soldering, compared with the method of WO 99/26754. Thus, a laser power of less than 10 W for 2 seconds is sufficient for carrying out the soldering. By reducing the required power, the danger of damage to the components to be fixed also decreases considerably, especially if they are microoptical components which are very heat-sensitive. The laser beam is substantially better absorbed by the metal layer than in the known method. It is therefore possible to use alloys having a high melting point. For the method according to the invention, the absorption coefficient of the metal layer need only be maximized to permit soldering on different types of baseplates, whereas the soldering power of the laser need only be adapted to the thermal expansion of the baseplate.

Since, in the method of the present invention, an uninterrupted, continuously planar metal layer is used, a considerable cost reduction in the production of the substrate is possible since a continuous metal layer can be substantially more easily produced than a metal pattern.

Of course, it is not necessary for the continuously planar metal layer to be applied to the entire baseplate. It is of course possible to apply to the baseplate a plurality of cohesive metal layers which are not connected to one another. In that fixing section in which the component is to be fixed with its base surface to the baseplate, however, the metal layer is substantially free of interruptions and continuously planar. It is possible to apply a plurality of planar elements to a baseplate in a pattern, which elements are each cohesive and continuously planar, but each planar element represents a separate fixing section to which the component is to be fixed, so that the projection of the base surface of the component is completely covered by one planar element. Continuously planar also does not inevitably mean a metal layer having an absolutely uniform layer thickness but a substantially cohesive surface which has substantially no interruptions, apart from small interruptions which occur in particular in the case of small layer thicknesses but are not produced artificially in the form of a patterned structure.

In an embodiment of the invention, the solder material is placed on the metal layer in the form of a flat piece which has, for example, the shape of a truncated cylinder. Thereafter, the component is arranged with its base surface above the solder material. An energy source, for example laser, is aligned below the baseplate and emits an energy beam from the bottom of the baseplate. The energy beam passes through the baseplate and strikes the metal layer on the top of the baseplate. The metal layer is subjected to localized heating here and thus heats the solder material, in a manner comparable with a stove plate. The flat piece of solder material melts and, in the liquefied state, assumes a drop-like form owing to the surface tension of the solder. Moreover, the solder material expands by a few hundred microns owing to the heating. As a result of the drop form and the expansion, the distance between the solder material and the base surface of the component decreases. Wetting of the base surface of the component with solder material thus occurs, so that a solder joint can be produced.

Alternatively, it is possible to reduce the intermediate space between the metal layer and the base surface of the component by lowering the component from a starting position towards the baseplate so that the base surface of the component dips into the molten solder material and the base surface of the component is thus wet with the solder material. Optionally, the component is withdrawn again to the starting position thereafter—before the beginning of solidification. In this embodiment, but also in the first one, it is conceivable to apply the solder material also or exclusively to the base surface of the component. Since, however, heating of a solder material which is bonded to the metal layer directly heated by the radiation is more effective, better results are obtained with a solder material applied directly to the metal layer.

In a further embodiment of the invention, the solder material is applied at least to a part of the metal layer of the baseplate, discretely in the form of a multiplicity of solder material elements a distance apart, for example in the form of a spot pattern, or in a continuously planar manner in the form of an uninterrupted layer. Here, this part is substantially larger than the actual fixing section which an individual component occupies. Optionally, the entire metal layer is coated with the solder material. An energy source, for example a laser, is aligned, as in the above method, below the baseplate and emits an energy beam from the bottom of the baseplate. The energy beam passes through the baseplate and strikes the metal layer. The latter heats up in a narrowly localized region and melts the solder material layer or the solder material pattern within this region. Drop formation occurs in this region owing to the surface tension of the solder. Thus, optionally by additional lowering of the component, the base surface of the component is wet with solder material so that a solder joint can be produced.

In another embodiment of the invention, a solder material in the form of a flat piece, in particular a truncated cylinder, is arranged on the baseplate, the cross-section of the flat piece being smaller than the cross-section of the base surface of the component, so that the projection of the base surface of the component onto the metal layer of the baseplate completely covers the cross-section of the flat piece—prior to melting. By reducing the cross-section of the flat piece, even higher accuracy of fixing is achievable.

By means of the soldering method according to the invention, accuracies of fixing in the region of 0.25 micron are achieved, so that this method is outstandingly suitable for the highly precise mounting of microoptical components on a baseplate.

The method is described in detail below. The invention is illustrated below by a specific embodiment with reference to figures.

The base surface of the miniaturized component must have good wettability for solder material. This base surface may be flat or convex, for example in the form of a convex spherical surface section or of a convex cylinder lateral surface section. A spherical base surface simplifies exact alignment of the component owing to the symmetry. By means of a rotationally symmetrical solder joint between the baseplate and the component, a stable joint having little distortion in the case of shrinkage and having good repeatability is achieved. This increases the process reliability and is particularly important for mass production.

Since the energy supply is from that side of the baseplate which is opposite the side coated with the metal layer, and hence the energy for heating the metal layer is supplied through the baseplate, it is necessary to choose a baseplate which is substantially transparent for the wavelength of the energy provided. If a laser beam is used as the energy source, the baseplate should have high transparency for the laser beam wavelength.

Moreover, the coefficients of thermal expansion of the baseplate and of the metal layer must correspond to the extent that no tearing or buckling of the metal layer should occur during or after the supply of the energy. Ideally, the coefficient of thermal expansion of the baseplate is equal to that of the metal layer. The material used for the production of the baseplate should be capable of withstanding high thermal loads since, on supplying energy, for example by means of a laser or UV, a part of the energy passed through the baseplate is inevitably absorbed by the baseplate. Moreover, strong heating occurs in a region of the metal layer which has high conductivity, and it is for this reason that the baseplate too is strongly heated in a locally limited region. If the baseplate comprises a material having poor thermal conductivity, for example glass, ceramic or glass ceramic, there is a high energy concentration in the locally limited region. This could lead to failure of the material in the case of an unsuitable choice of material. If the mutual alignment of a plurality of components is important, it is also necessary to ensure that no material which has a high coefficient of thermal expansion is chosen as the baseplate since the alignment of the optical components changes in the event of heating of the baseplate. This would inevitably lead to optical errors in the optical system. Suitable materials for the baseplate are, for example, glass, sapphire, ceramic, glass ceramic, silicon or Pyrex. Further suitable materials are known from the prior art.

The metal layer may be formed from a plurality of layers of different metals and alloys and optionally coated with an antioxidant, flux, etc. Preferably, the alloy of the metal layer should have little tendency to oxidize and should contain gold.

In an embodiment of the invention, a sapphire piece or a Pyrex wafer having a thickness of about 1 to 2 millimeters is chosen as the baseplate. The wafer is coated with a metal layer comprising chromium, nickel and gold. The metal layer has a thickness of about 1 micron. The solder material chosen is, however, SnPb or Sn96Ag4, which fills a gap between the metal layer and the base surface of the component of 0.2 to 0.5 millimeter.

The shrinkage of the solder material during cooling inevitably ensures a vertical offset of the component perpendicularly to the baseplate. It has good repeatability and is a function of the gap between the baseplate and the base surface of the component. For compensation of this vertical shrinkage, it is possible to position the component correspondingly higher and to take the shrinkage into account in the prepositioning.

In a further embodiment of the invention, the accuracy of mounting is further increased, especially in the case of an inclined component, by reducing the cross-section of the solder material, for example the diameter of the flat piece, so that this cross-section is smaller than that of the base surface of the component. In this case, the diameter d of the flat piece of solder material is smaller than the diameter D of the base surface of the component. At the latest after solidification of the solder material, the diameter of the solidified solder material is smaller than the diameter D of the base surface. This results in less asymmetries on solidification of the solder material, which may occur in particular because of the fact that the solder material cools substantially more rapidly on the transverse surfaces than in the middle. Especially in the case of inclined mounting of a component, it is therefore advantageous to provide a solder joint with little solder material since, in this case, shrinkages do not have an effect to such an extent. Moreover, there are in this case fewer stresses which result from the cooling and the associated shrinkage, so that the manufacturing accuracy is further increased.

The method is suitable in particular for use in an automatic, flux-free laser soldering process since substantially all required steps can be carried out by handling robots which have a highly accurate position sensor system. Thus, each component can be positioned in a highly precise manner freely in space in all 6 degrees of freedom. The free positionability, which is not inevitably limited by predetermined regions on the baseplate, is a further advantage of the invention. If the entire baseplate is coated with the metal layer, it is possible to position the component in any desired position on the baseplate either by free positioning of a flat piece of solder material or by means of a solder material layer.

This technique described here is suitable in particular for highly accurate fixing of microoptical components, oriented in all 6 degrees of freedom. Thus, the miniaturized component may serve as a holder for a microoptical element, for example a lens, an optical fibre, a laser diode, etc. Such microoptical components typically have a diameter of the order of magnitude of 2.6 mm and a height of 3.5 mm. A possible example of a holding device for a microoptical component is described in EP 1127287 B1.

A further embodiment of the invention comprises a baseplate having a plurality of miniaturized components which are arranged within a component region of the baseplate and in each case have at least one microoptical element. At least the component region of the baseplate is coated on the top with at least one metal layer, the metal layer on the top of the baseplate being applied in a continuously planar manner at least in the component region and hence being free of interruptions. The components are fixed with the base surface above in each case one solder joint on the metal layer. The baseplate is transparent to laser radiation. The component region is a part of the baseplate on which a plurality of parts are arranged on the cohesive metal layer. In a possible embodiment, the metal layer is applied in a continuously planar manner to the entire top of the baseplate and hence substantially without interruptions. In this case, the component region is formed by the entire baseplate. The solder material of the solder joint preferably has a concave outer surface.

In a special embodiment, at least one of the plurality of components comprises a holder for holding a supporting part on which the at least one microoptical element in each case is fixed, the holder being connected to the supporting part, and the supporting part to the microoptical element, by means of soldering points. Such a holder is also described in EP 1127287 B1.

The substrate for use in the method according to the invention is formed by a baseplate which is transparent to laser radiation and is coated on one side with at least one metal layer which is applied in a continuously planar manner substantially to the entire side and is thus substantially free of interruptions. Optionally, the substrate is coated with a layer of solder material which is applied in a continuously planar manner at least to a part of the metal layer of the baseplate, so that the layer of solder material is free of interruptions in the part. Alternatively, the layer of solder material is applied, in at least one part on the metal layer of the baseplate, in a pattern comprising a multiplicity of solder material elements a distance apart.

The invention is described in more detail below with reference to specific embodiments shown schematically in the drawings. Specifically:

FIGS. 5a, 5b show a component and a substrate with a layer of solder material applied in a continuously planar manner, before (FIG. 5a) and after (FIG. 5b) the production of the solder joint; and FIG. 6 shows a component which comprises a holder for holding a supporting part on which a microoptical element is fixed.

Figures 1A, 1B:
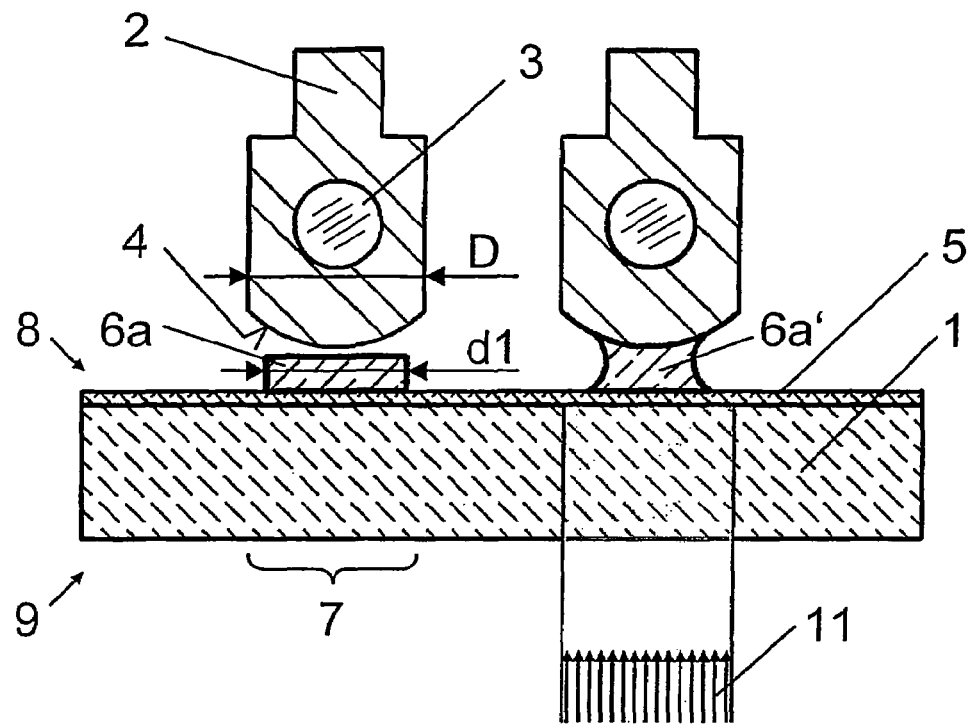
FIG. 1a, 1b show the arrangement of a component, of a solder material in the form of a small piece and of a substrate before (FIG. 1a) and after (FIG. 1b) the production of the solder joint.
Figures 2A, 2B:
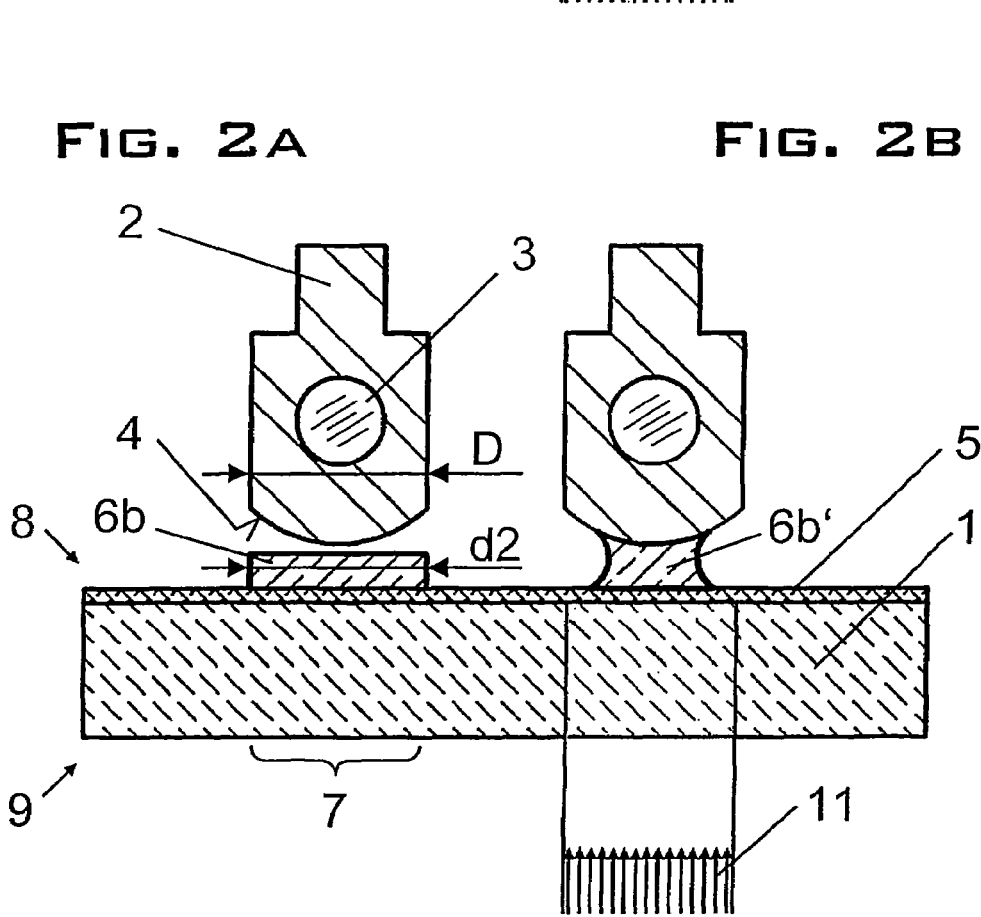
FIGS. 2a, 2b show the arrangement of a component, of a solder material in the form of a large flat piece and of a substrate before (FIG. 2a) and after (FIG. 2b) the production of the solder joint.

FIG. 1a and FIG. 2a each show a baseplate 1 having a top 8 and a bottom 9 in a state before production of a solder joint. The baseplate 1 which is transparent to laser radiation is coated on its top 8 with a metal layer 5 which is applied in a continuously planar manner so that it is substantially free of interruptions. The baseplate 1 and the metal layer 5 form a so-called substrate. Within a fixing section 7 on the metal layer 5 a solder material 6a, 6b in the form of a flat piece, which, in the not yet molten state, has the shape of a truncated cylinder but may also have another shape is applied to the metal layer 5. The fixing section 7 is that section on which a single component 2 is to be fixed or is fixed. A miniaturized component 2 which carries a microoptical element 3 is arranged above the fixing section 7 of the baseplate 1 so that the solder material 6a, 6b and a convex base surface 4 of the component 2 are present opposite one another without contact, a vertical distance apart and so as to form a vertical intermediate space. The component 2 is positioned and held in a highly precise manner by means of a robot station (not shown), the expected vertical shrinkage being taken into account. In FIG. 1a, the solder material 6a in the form of a flat piece has a diameter d1 which is smaller than the diameter D of the base surface 4 of the component 2, so that d1<D, whereas the solder material 6b in the nonmolten state in FIG. 2a has a diameter d2 which is equal to the diameter D, so that d2=D.

Figure 3:
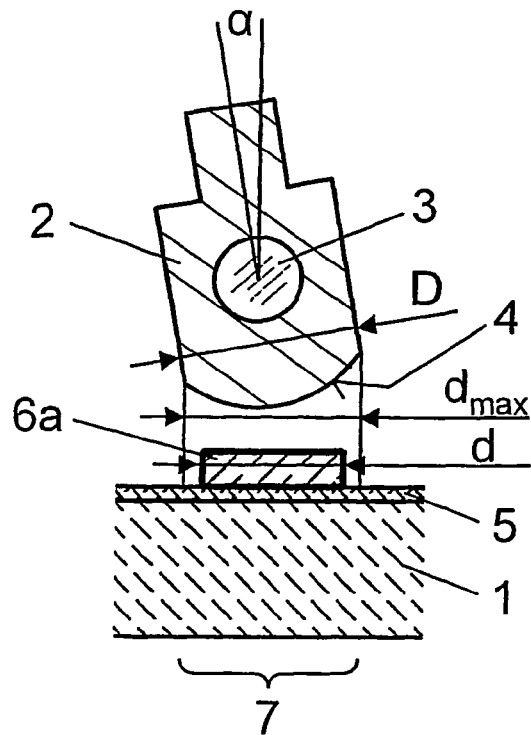
FIG. 3 shows the determination of the diameter d of a solder material in the form of a flat piece in the case of component inclination of $\alpha_{max}=\pm 5°$.

By supplying laser radiation locally limited to the fixing section 7 and passing through the baseplate 1, in the form of a laser beam 11, from the bottom 9 of the baseplate 1, the metal layer 5 is strongly heated at least within the fixing section 7 and acts as a sort of stove plate, so that the solder material 6a, 6b melts, forms a drop owing to the surface tension, wets the base surface 4, flows into the intermediate space and thus produces a joint between the metal layer 5 and the base surface 4. Thereafter, the laser radiation 11 is deactivated again and time is allowed for the molten solder material 6a', 6b' to solidify. FIGS. 1b and 2b show the state after production of the joint with the molten solder material 6a', 6b'. In both cases, the vertical distance between the component 2 and the baseplate 1 decreases as a result of the shrinkage of the solder material 6a', 6b'. Moreover, the diameter of the molten solder material 6a', 6b' decreases in comparison with the diameter d1, d2 of the solder material 6a, 6b in the nonmolten state, it being true both in FIG. 1a for d1<D and in FIG. 2a for d2=D that the diameter of the molten solder material 6a', 6b' is smaller than D. Here, the molten material 6a' in FIG. 1b has a smaller diameter than the molten solder material 6b' in FIG. 2b. The lateral surface of the solder material 6a', 6b' has a concave shape. FIG. 3 shows the determination of the diameter d of a solder material 6a in the form of a small flat piece in the case of an inclination of the component 2 of $\alpha_{max}=\pm 5°$. Assuming that the diameter D of the base surface 4 of the component 2 is, for example, D=2.6 mm, the radius of the round part of the base surface 4 is r=1.6 mm and the angle of inclination of the component 2 is $\alpha_{max}=\pm 5°$, a maximum diameter of $d_{max}=2.43$ mm is obtained for the diameter d of the contacting solder material 6a in the form of a flat piece. The ideal distance arises from the requirement that the solder material 6a should not be in contact with the base surface 4 before production of the joint, even in the case of an inclined component 2. In order to meet this requirement, the diameter d of the small flat piece of solder material 6a is reduced by 20% relative to $d_{max}$, so that d=2.43·(1−0.2)=1.94 mm.

Figures 4A, 4B:
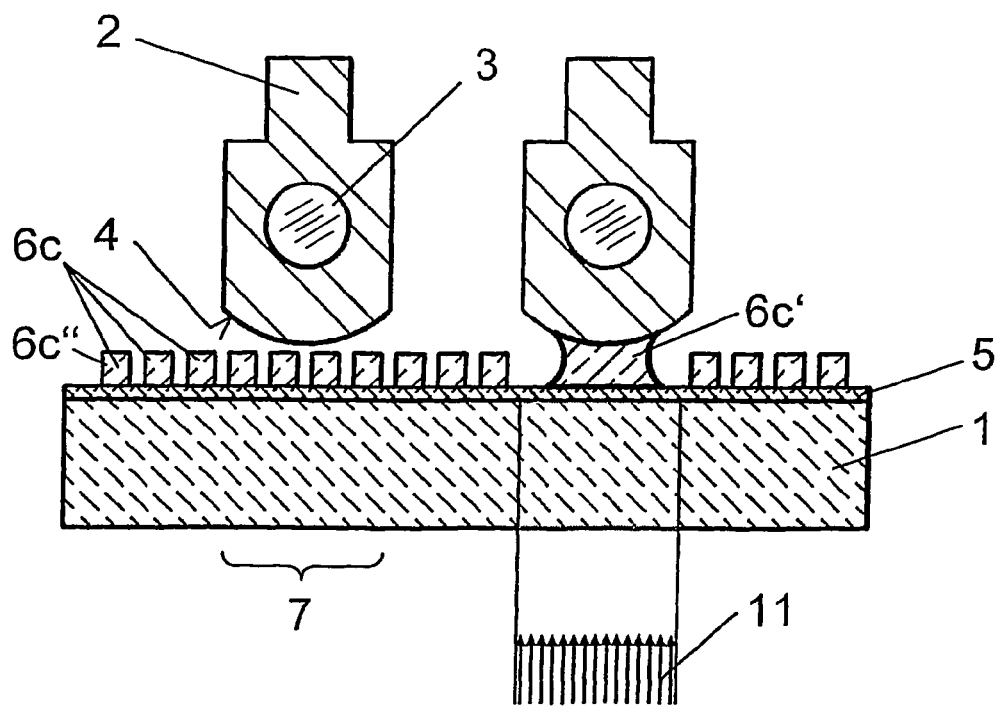
FIGS. 4a, 4b show a component and a substrate with a layer of solder material which is applied in a pattern comprising a multiplicity of solder material elements a distance apart, before (FIG. 4a) and after (FIG. 4b) the production of the solder joint.

FIGS. 4a and 4b show a component 2 and a substrate comprising baseplate 1 and metal layer 5 with a layer of solder material 6c applied in a pattern comprising a multiplicity of solder material elements 6c" a distance apart, before (FIG. 4a) and after (FIG. 4b) the production of the solder joint. The solder material here 6c in the form of a pattern is applied to the entire metal layer 5. A locally limited laser beam 11 melts a plurality of solder material elements 6c" of the solder material layer 6c and causes them to coalesce to form a drop of solder material 6c' which, as in FIGS. 1a/1b and 2a/2b, produces the joint between the base surface 4 of the component 2 and the metal layer 5 of the baseplate 1. FIGS. 5a and 5b, on the other hand, show a component 2 and a substrate having a layer of solder material 6d applied in a continuously planar manner, before (FIG. 5a) and after (FIG. 5b) the production of the solder joint. Here, a laser beam 11 melts a part of the solder material 6d, which forms into a drop of solder material 6d' and produces a joint between the component 2 and the baseplate 1.

FIG. 6 shows an embodiment of a component 2 which comprises a holder 2' for holding a supporting part 2" on which a microoptical element 3 is fixed, the holder 2' being joined to the supporting part 2", and the supporting part 2" to the microoptical element 3 by means of soldering points 10. In order to permit a solder joint 10, the component 2 has a base surface 4.

The invention claimed is:

1. A method for highly precise, freely positionable fixing of a miniaturized component, in particular comprising a microoptical element, to a predetermined fixing section of a baseplate by means of a solder joint, the baseplate having a top and a bottom and the component having a base surface, at least the fixing section of the baseplate being coated on the top with at least one metal layer, and solder material being applied at least to the fixing section of the baseplate, which section is coated with the metal layer, the method comprising the steps of:

arranging and holding the component above the fixing section of the baseplate in a starting position with a vertical distance between the base surface and the metal layer, the solder material on the metal layer being present in the intermediate space between the metal layer and the base surface, and the solder material and the base surface of the component being present opposite one another without contact, a vertical distance apart so as to form a solder-free intermediate space between the solder material and the base surface, while the component is held in the starting position above the fixing section with the vertical distance between the base surface and the metal layer, supplying heat energy in a region locally limited to the fixing section for at least partial melting of the solder material from the bottom of the baseplate so that, as a result of drop formation of the molten solder material, the solder-free intermediate space is filled with the molten solder material for mutual fixing, and waiting for the mutual fixing, the metal layer being applied to the top of the baseplate at least in the fixing section in a continuously planar manner and thus being without interruptions in the fixing section.

2. The method according to claim 1, the metal layer being applied in a continuously planar manner to the entire top of the baseplate and thus being without interruptions over the entire top of the baseplate.

3. The method according to claim 1, the step of supplying heat energy comprising the following part-steps:

supplying heat energy in a region locally limited to the fixing section for melting the solder material from the bottom of the baseplate and reducing the intermediate space between the molten solder material and the base surface of the component by lowering the component from a starting position towards the baseplate so that the base surface of the component dips into the molten solder material and the base surface of the component is wet.

4. The method according to claim 3, comprising the further part-step:

repositioning of the component in the starting position.

5. The method according to claim 1, the supply of heat energy being effected from the bottom of the baseplate by a beam of electromagnetic waves which is directed at the fixing section, heats the metal layer and thus melts the solder material.

6. The method according to claim 5, the beam being a laser beam and the baseplate being transparent to laser radiation.

7. The method according to claim 1, the base surface of the component being convex.

8. The method according to claim 7, the base surface of the component having the form of a convex spherical surface section.

9. The method according to claim 7, the base surface of the component having the form of a convex cylinder lateral surface section.

10. The method according to claim 1, the solder material being applied to at least that fixing section of the baseplate which is coated with the metal layer, in a maimer such that, in the still nonmolten state of the solder material, the base surface of the component which is projected onto the top of the baseplate completely covers the cross-sectional area of the solder material.

11. The method according to claim 1, the solder material being applied at least to that fixing section of the baseplate which is coated with the metal layer, in a manner such that, in the still nonmolten state, it has the form of a flat piece, in particular that of a flat truncated cylinder.

12. The method according to claim 1, the solder material in a region containing the fixing section being applied to the metal layer, the region being larger than the fixing section contained therein.

13. The method according to claim 12, the solder material being applied in a continuously planar manner in the region on the metal layer of the baseplate and thus being free of interruptions in the region.

14. The method according to claim 12, the solder material being applied in the region on the metal layer of the baseplate in a pattern comprising a multiplicity of solder material elements a distance apart.

* * * * *